US006516210B1

(12) United States Patent
Foxall

(10) Patent No.: US 6,516,210 B1
(45) Date of Patent: Feb. 4, 2003

(54) SIGNAL ANALYSIS FOR NAVIGATED MAGNETIC RESONANCE IMAGING

(75) Inventor: David L. Foxall, Mentor, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 143 days.

(21) Appl. No.: 09/718,728

(22) Filed: Nov. 22, 2000

(51) Int. Cl.[7] .................................................. A61B 5/05

(52) U.S. Cl. ........................ 600/410; 600/413; 600/428; 600/534; 324/307; 324/309

(58) Field of Search ................................ 600/410, 413; 324/309, 307; 128/899

(56) References Cited

U.S. PATENT DOCUMENTS

| 4,720,678 | A | | 1/1988 | Glover et al. | |
|---|---|---|---|---|---|
| 5,427,101 | A | * | 6/1995 | Sachs et al. | 324/309 |
| 5,539,312 | A | * | 7/1996 | Fu et al. | 324/309 |
| 6,144,874 | A | * | 11/2000 | Du | 324/307 |

OTHER PUBLICATIONS

T. A. Spraggins, "Wireless Retrospective Gating: Application to Cine Cardiac Imaging," *Magnetic Resonance Imaging*, vol. 8, pp. 675, 681, 1990.

T. A. Spraggins, et al., "Retrospective Cardiac Gating Requiring No Physiological Monitoring," SMRM 7th Annual Meeting WIP, p. 104, 1998.

W. S. Kim, et al., "Extraction of Cardiac and Respiratory Motion Cycles by Use of Projection Data in NMR Imaging," SMRM 7th Annual Meeting Abstracts, p. 958, 1998.

R. S. Hinks, "Monitored Echo Gating (MEGA) for the Reduction of Data Errors and Image Artifacts," SMRM 7th Annual Meeting Abstracts, p. 744, 1998.

R. Sinkus, et al., "Motion Pattern Adapted Real–Time Respiratory Gating," *Magnetic Resonance in Medicine*, 41:148–155 (1999).

T. Foo, et al., "A Computationally Efficient Method for Tracking Reference Position Displacements for Motion Compensation in Magnetic Resonance Imaging," *Magnetic Resonance in Medicine*, 42:548–553 (1999).

Y. Wang, et al., "Algorithms for Extracting Motion Information from Navigator Echoes," *Magnetic Resonance in Medicine*, 36:117–123 (1996).

A. M. Taylor, et al., "MR Navigator—Echo Monitoring of Temporal Changes in Diaphragm Position: Implications for MR Coronary Angiography," *JMRI*, 7:629–636 (1997).

M. Weiger, et al., Motion–Adapted Gating Based on k–Space Weighting for Reduction of Respiratory Motion Artifacts, *Magnetic Resonance in Medicine*, 38:322–333, 1997.

E. Nagel, et al., "Optimization of Realtime Adaptive Navigator Correction for 3D Magnetic Resonance Coronary Angiography," *Magnetic Resonance in Medicine*, 42:408–411 (1999).

(List continued on next page.)

*Primary Examiner*—George Manuel
*Assistant Examiner*—Barry Pass
(74) *Attorney, Agent, or Firm*—Fay, Sharpe, Fagan, Minnich & McKee, LLP

(57) ABSTRACT

A method of imaging a patient with an MRI scanner (10) includes imaging a region of interest of the patient with the MRI scanner (10) and acquiring image data resulting from the imaging. An image of the region of interest is reconstructed from the image data. The method also includes generating navigator echos during the imaging, collecting the navigator echos and deriving, from each navigator echo, a measurement of patient motion experience during the imaging. A historical record of the measurements is maintained. Parameters for the acquisition of image data are selected to compensate for motion, or specific image data is selected for reconstruction, based on the historical record.

13 Claims, 2 Drawing Sheets

OTHER PUBLICATIONS

P. Jhooti, et al., "3D Coronary Artery Imaging with Phase Reordering for Improved Scan Efficiency," *Magnetic Resonance in Medicine*, 41:555–562 (1999).

T. Sachs, et al., "The Diminishing Variance Algorithm for Real–Time Reduction of Motion Artifacts in MRI," *Magnetic Resonance in Medicine*, 34:412–422 (1995).

D. Bohning, et al., "PC–Based System for Retrospective Caridac and Respiratory Gating of NMR Data," *Magnetic Resonance in Medicine*, 16:303–316 (1990).

* cited by examiner

SIGNAL ANALYSIS FOR NAVIGATED MAGNETIC RESONANCE IMAGING

BACKGROUND OF THE INVENTION

The present invention relates to the art of medical imaging. It finds particular application in conjunction with magnetic resonance imaging (MRI), and will be described with particular reference thereto. However, it is to be appreciated that the present invention is also amenable to other like applications.

The medical field has found MRI to be a valuable diagnostic tool for the non-invasive study or examination of a patient's anatomy. Various MRI scanners and apparatus have been describe in detail in the prior art. As is known in the art, by applying a particular combination of radio frequency (RF) pulses and magnetic gradients to a spin system set up in a region of interest, a signal therefrom (often comprising a plurality of echos) can be induced, received and processed into an image representation of the region of interest.

Generally, in MRI, a substantially uniform temporally constant main magnetic field, $B_0$, is set up in an examination region in which a subject being imaged or examined is placed. Nuclei in the subject have spins which in the presence of the main magnetic field produce a net magnetization. The nuclei of the spin system precess in the magnetic field at the Larmor frequency, i.e., the resonant frequency. Radio frequency (RF) magnetic fields at and/or near the resonant frequency are used to manipulate the net magnetization of the spin system. Among other things, RF magnetic fields at the resonant frequency are used to, at least partially, tip the net magnetization from alignment with the main magnetic field into a plane transverse thereto. This is known as excitation, and the excited spins produce a magnetic field, at the resonant frequency, that is in turn observed by a receiver system. Shaped RF pulses applied in conjunction with gradient magnetic fields are used to manipulate magnetization in selected regions of the subject and produce a magnetic resonance (MR) signal. The resultant MR signal may be further manipulated through additional RF and/or gradient field manipulations to produce a series of echos (i.e., an echo train) as the signal decays. The various echos making up the MRI signal are typically encoded via magnetic gradients set up in the main magnetic field. The raw data from the MRI scanner is collected into a matrix commonly known as k-space. Typically, each echo is sampled a plurality of times to generate a data line or row of data points in k-space. The echo or data line's position in k-space (i.e., its relative k-space row) is typically determined by its gradient encoding. Ultimately, in an imaging experiment, by employing Inverse Fourier or other known transformations, an image representation of the subject is reconstructed from the k-space (or reciprocal space) data.

Patient motion can often be a factor in MRI. For example, patient motion can give rise to degraded image quality as a result of motion artifacts. Typical motions that may present issues include cyclical type motions resulting from natural biological functions, i.e., cardiac and respiratory motion. As is known in the art, however, the motion of body parts can be monitored in MRI by generating, collecting and processing navigator echos, which are separate from the echos used for imaging. The navigator echos or navigator signal is typically obtained as a one-dimensional (1D) projection of some region of the body that is moving in some cyclic manner, e.g., the chest wall, the diaphragm, cardiac blood flow, etc. As is known in the art, a motion measure or motion data is commonly derived from the resulting navigator data by a series of processing steps including, e.g., Fourier transformation, summation, integration, edge detection, cross-correlation, least squares error determination, linear phase shifting, etc.

The issue concerning the present invention is the manner in which the motion measure or motion data is employed or processed to gate the image data to the motion, i.e., to decide the acceptance, rejection and/or binning of image data or to trigger generation or regulate acquisition of the image data, preferably, to substantially reduce or eliminate motion artifacts in a reconstructed image representation.

In general, gating is alternately used prospectively to trigger the generation and/or regulate the acquisition of image data to repeatedly correspond to a desired location in a motion cycle, or it is used retrospectively to select or identify a specific fraction of image data from a set of continuously acquired image data, where the specific image data corresponds to a desired location in a motion cycle. In either case, a complete set of image data for a particular image reconstruction can be generated and/or acquired over a number of motion cycles and still be made to consistently correspond to the same location in the motion cycle. In this manner motion artifacts can be substantially reduced or eliminated insomuch as the reconstructed image is reconstructed from image data that all corresponds to the same location in the motion cycle.

In typical previously developed techniques, motion data is obtained from navigator echos generated via a prescan pulse sequence and used to observe motion patterns prior to an imaging scan. During the imaging scan then, navigator echos are periodically inserted, e.g., before or after lines or other segments of image data. The inserted navigator echos are processed and the resulting motion data used to determine the obtained image data's relative correspondence to the previously observed motion pattern. The image data is then optionally gated (i.e., rejected, accepted, binned, triggered or acquired) accordingly.

The aforementioned previously developed techniques have a number of undesirable limitations. For example, the resulting navigator data derived from the inserted navigator echos, and hence the corresponding image data, is referenced and/or correlated to a fixed motion pattern observed prior to the imaging scan. Consequently, the technique does not and cannot compensate for dynamic changes in the motion experienced during the imaging scan, e.g., as may result from an irregular or changing breath volume. Moreover, while substantially stable, the motion pattern during the imaging scan may be different than the motion pattern observed in the pre-scan. Again, when a fixed pre-scan motion pattern is used as a point of reference, compensation cannot be achieved for a relative change in the motion pattern at the time of imaging. Additionally, the aforementioned techniques with their fixed frame of reference cannot compensate for random non-cyclical motions, e.g., as may result from singular voluntary (albeit perhaps unintentional) patient shifts or other like haphazard movements.

The present invention contemplates a new and improved technique for navigator echo analysis and motion gating in MRI which overcomes the above-referenced problems and others.

SUMMARY OF THE INVENTION

In accordance with one aspect of the present invention, a method of imaging a patient with an MRI scanner is provided. The method includes imaging a region of interest of the patient with the MRI scanner and acquiring image data resulting from the imaging. An image of the region of interest is reconstructed from the image data. The method also includes generating navigator echos during the imaging, collecting the navigator echos and deriving, from each navigator echo, a measurement of patient motion experience during the imaging. A historical record of the measurements is maintained. Parameters for the acquisition of image data are selected to compensate for motion, or specific image data is selected for reconstruction, based on the historical record.

In accordance with a more limited aspect of the present invention, the historical record is iteratively updated during the imaging as successive measurements are derived.

In accordance with a more limited aspect of the present invention, the historical record comprises all of the measurements obtained during the imaging.

In accordance with a more limited aspect of the present invention, the historical record comprises a fraction of all the measurements obtained during the imaging, said fraction corresponding to those measurements most recently obtained.

In accordance with a more limited aspect of the present invention, the method further includes sorting the measurements in the historical record by their respective values and determining a cumulative distribution from the sorted measurements such that the cumulative distribution acts as a reference for gating the image.

In accordance with a more limited aspect of the present invention, the method further includes associating the image data with measurements based on the respective image data's temporal proximity to the navigator echo from which each measurement was derived and determining at least one of a maximum and a minimum measurement limit from the historical record such that image data associated with a measurement beyond the limit is not used in reconstructing the image.

In accordance with another aspect of the present invention, a medical imaging apparatus includes an MRI scanner which obtains images of a patient positioned therein. The MRI scanner is also operable to produce navigator echos during imaging of the patient with the MRI scanner. A motion detection means processes each of the navigator echos to obtain motion measurements representative of a state of motion of the patient during imaging, and a storage device maintains a historical record of the motion measurements. A gating processor accesses the historical record and gates the images obtained from the MRI scanner.

In accordance with a more limited aspect of the present invention, the medical imaging apparatus further includes a sorter which sorts the motion measurements in the historical record according to their respective values, and means for determining a cumulative distribution from the sorted motion measurements. The cumulative distribution then acts as a frame of reference for the gating carried out by the gating processor.

In accordance with a more limited aspect of the present invention, the medical imaging apparatus further includes a reconstruction processor which reconstructs image data obtained from the MRI scanner into images and a statistical analyzer which determines statistical properties of the cumulative distribution. The statistical properties are used to compute at least one of a maximum and minimum motion measurement limit such that image data obtained from the MRI scanner when an associated motion measurement is beyond the limit is not used in reconstructing the image.

In accordance with a more limited aspect of the present invention, the historical record is iteratively updated during the imaging as successive motion measurements are obtained.

In accordance with a more limited aspect of the present invention, the historical record comprises all of the motion measurements obtained during the imaging.

In accordance with a more limited aspect of the present invention, the historical record comprises a fraction of all the motion measurements obtained during the imaging, said fraction corresponding to those motion measurements most recently obtained.

In accordance with a more limited aspect of the present invention, the medical imaging apparatus further includes a human-viewable output device for rendering images obtained from the MRI scanner.

One advantage of the present invention is that it functions for not only regular cyclical movement but for irregular or unstable movements also. The technique of the present invention is fairly model free, i.e., it make no assumptions about periodicity, frequency, etc.

Another advantage of the present invention is that the technique compensates for dynamic changes in the motion experienced during the imaging experiment.

Another advantage of the present invention is that it can be applied to motion measurements from multiple navigators, and cumulative distributions in multiple dimensions may be calculated and correlated.

Yet another advantage of the present invention is that spurious image data may be rejected when associated the motion measurements are outside maximum and minimum limits.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
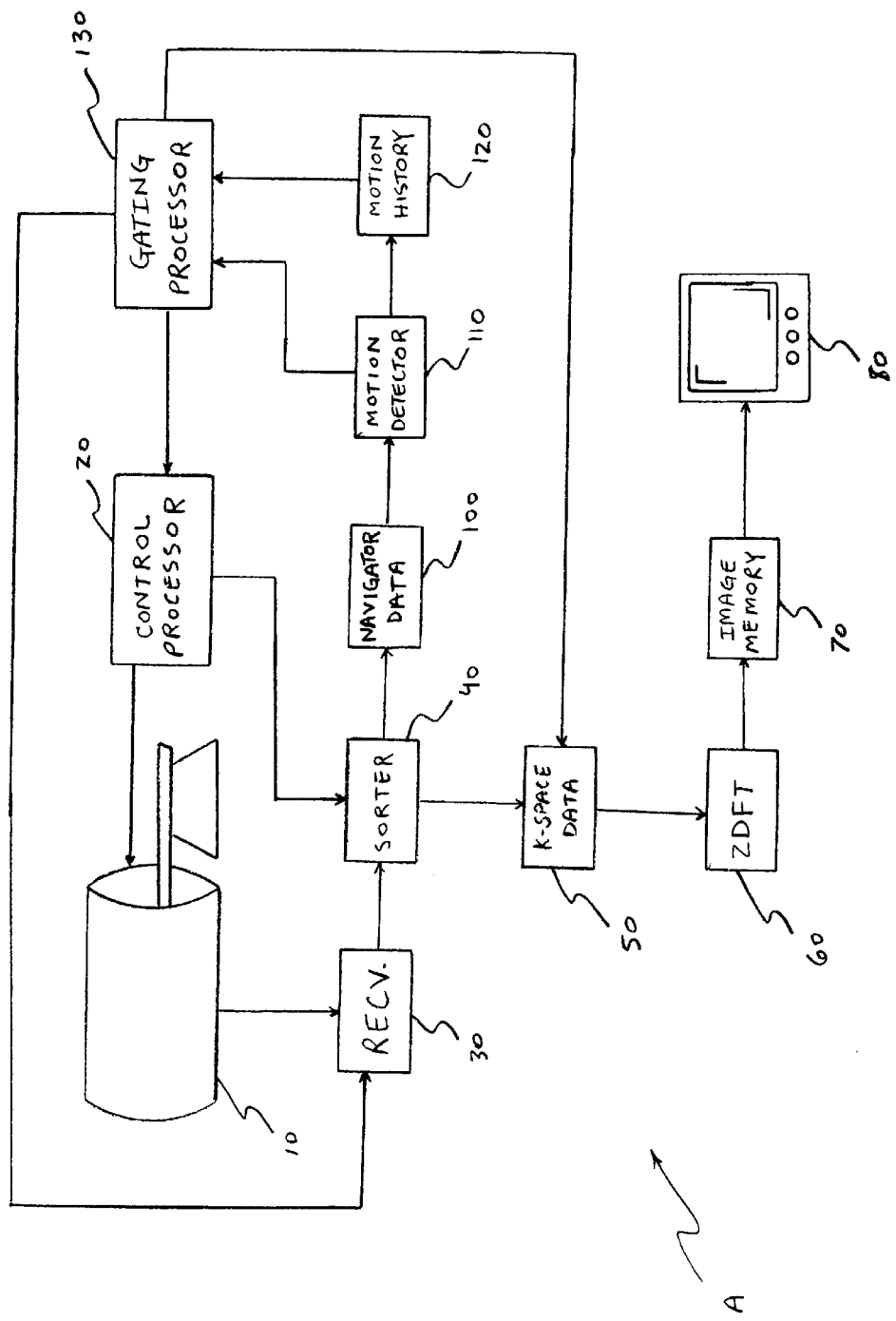
FIG. 1 is a diagrammatic illustration showing an MRI apparatus in accordance with aspects of the present invention; and, FIG. 2 is a diagrammatic illustration showing a motion history module in accordance with aspects of the present invention.

With reference to FIG. 1, an exemplary medical imaging apparatus A in accordance with aspects of the present invention includes an MRI scanner 10 such as those known in the art. While the MRI scanner 10 depicted in FIG. 1 is the central bore type, alternate types of MRI scanners (e.g., so called open-magnet scanners) are equally applicable. In any event, as is known in the art, the MRI scanner 10 is employed to non-invasively acquire medical images or image representations of a region of interest of a patient positioned therein. Optionally, the images are three-dimensional (3D) images or image representations, two-dimensional (2D) cross-sectional slices, surface renderings, or the like.

In a preferred embodiment, a control processor 20, directs the MRI scanner 10 to carry out imaging experiments in the usual manner. That is, a desired MR pulse sequence is applied via the MRI scanner 10 to achieve selected MR manipulations. The pulse sequence preferably entails a series of RF and magnetic gradient pulses that are applied to invert or excite magnetic spins, induce magnetic resonance, refocus magnetic resonance, spatially and otherwise encode the magnetic resonance, to saturate spins, and the like. A typical RF pulse is composed of a packet of immediately contiguous pulse segments of short duration which taken together with each other and any applied magnetic gradients achieve the selected MR manipulation. Optionally, the pulse sequence selected is a spin echo (SE) sequence, a fast spin echo (FSE) sequence, a single shot FSE sequence, a 3D volume FSE sequence, a gradient echo or field echo (FE) sequence, an echo-planar imaging (EPI) sequence, an echo volume imaging sequence, a gradient and spin echo (GSE) sequence, or any other known imaging sequence which induces a resulting resonance signal from the patient which is observable by a reception system.

Typically, the induced signal which is observed by the reception system includes a plurality of imaging echos. In a preferred embodiment, the reception system comprises a receiver 30 (optionally digital) which receives and demodulates the signal. As is known in the art, for a selected pulse sequence, each imaging echo of the signal is preferably sampled by the receiver 30 multiple times to generate a line or segment of raw image data. In this manner, the image data is acquired.

In the illustrated embodiment, under the direction of the control processor 20, a sorter 40 (optionally downstream from the receiver 30) routes the data received from the receiver 30. Alternately, data routing is simply carried out by the receiver 30, optionally under the direction of the control processor 20. In any event, the raw image data corresponding to the sampled imaging echos is routed to a buffer or memory 50 where it is loaded or binned into or otherwise arranged in a matrix commonly known as k-space. Preferably, based upon the particular gradient encoding imparted to each echo, the corresponding raw data is mapped to or otherwise assigned a location in k-space. Optionally, as an alternative to the memory 50, other storage devices may be employed, e.g., the raw image or k-space data may be magnetically or optically stored on a disk or tape.

While not shown, depending on the pulse sequence employed, the usual k-space data corrections and/or processing is optionally carried out at an appropriate point along the data processing stream. For example, where an FSE sequence is used, a phase correction may be optionally applied to properly align the data in k-space.

Preferably after k-space has been filled, a multidimensional (e.g., 2D) Inverse Fourier transform and/or other appropriate reconstruction algorithms are applied to the k-space data by a reconstruction processor 60. That is to say, the reconstruction processor 60 accesses the buffer or memory 50 and performs on the k-space data therein a Inverse Fourier transformation and/or other appropriate algorithms, as are known in the art, to reconstruct an image representation of the region or interest of the patient. The image may represent a planar slice through the patient, an array of parallel planar slices, a 3D volume, a surface rendering or the like. The reconstructed image is then stored in an image memory 70 from which it may be selectively accessed and formatted for display on an output device, such as a video monitor 80 or other human viewable display or output device that provides a depiction of the resultant image.

In a preferred embodiment, the control processor 20 directs the operation of the MRI scanner 10 to induce navigator echos which are periodically interspersed among the imaging echos. As with the imaging echos, the navigator echos are received and demodulated by the receiver 30. The navigator echos are preferably sampled by the receiver 30 multiple times to generate raw navigator data.

In similar fashion to the raw image data, the navigator data corresponding to the sampled navigator echos is routed to a buffer or memory 100 where it is loaded or otherwise held. Optionally, as an alternative to the memory 100, other storage devices may be employed, e.g., the navigator data may be magnetically or optically stored on a disk or tape. The navigator data is preferably obtained as a 1D projection of some region of the body or patient anatomy that is moving in some manner, either from natural cyclical biological functions such as respiration or cardiac function, or otherwise, e.g., from voluntary (albeit perhaps unintentional) patient shifts or haphazard random movements. As is known in the art, using a series of processing steps including, e.g., Fourier transformation, summation, integration, edge detection, cross-correlation, least squares error determination, linear phase shifting, etc., a motion detection processor 110 derives a motion measure or motion data from the resulting navigator data. In this manner, the navigator data is acquired and processed to dynamically monitor the motion experienced during the imaging experiment.

As the image data is acquired, it is associated with motion measurements based on the respective image data's temporal proximity to the navigator echo from which each motion measurement was derived. That is, the image data is collected or acquired over a period of time, and potentially the patient or his anatomy may be experiencing movement within that period of time. Accordingly, each imaging echo, and hence, each line or segment of image data corresponding thereto, is generated or acquire when the patient or anatomy is in a particular state of motion. As image data is repeatedly acquired from each of a plurality of imaging echos and the navigator data is repeatedly acquired from each of a plurality of navigator echos interspersed among the imaging echos, at any given time, the image data being acquired is associated with the current motion measurement derived from the corresponding navigator data. In other words, during the imaging experiment, the motion experienced when lines or segments of image data are collected or acquired is determined by the motion measurement derived from the navigator echo induced at or around the time the respective image echos from which the respective lines or segments of image data originate.

Figure 2:
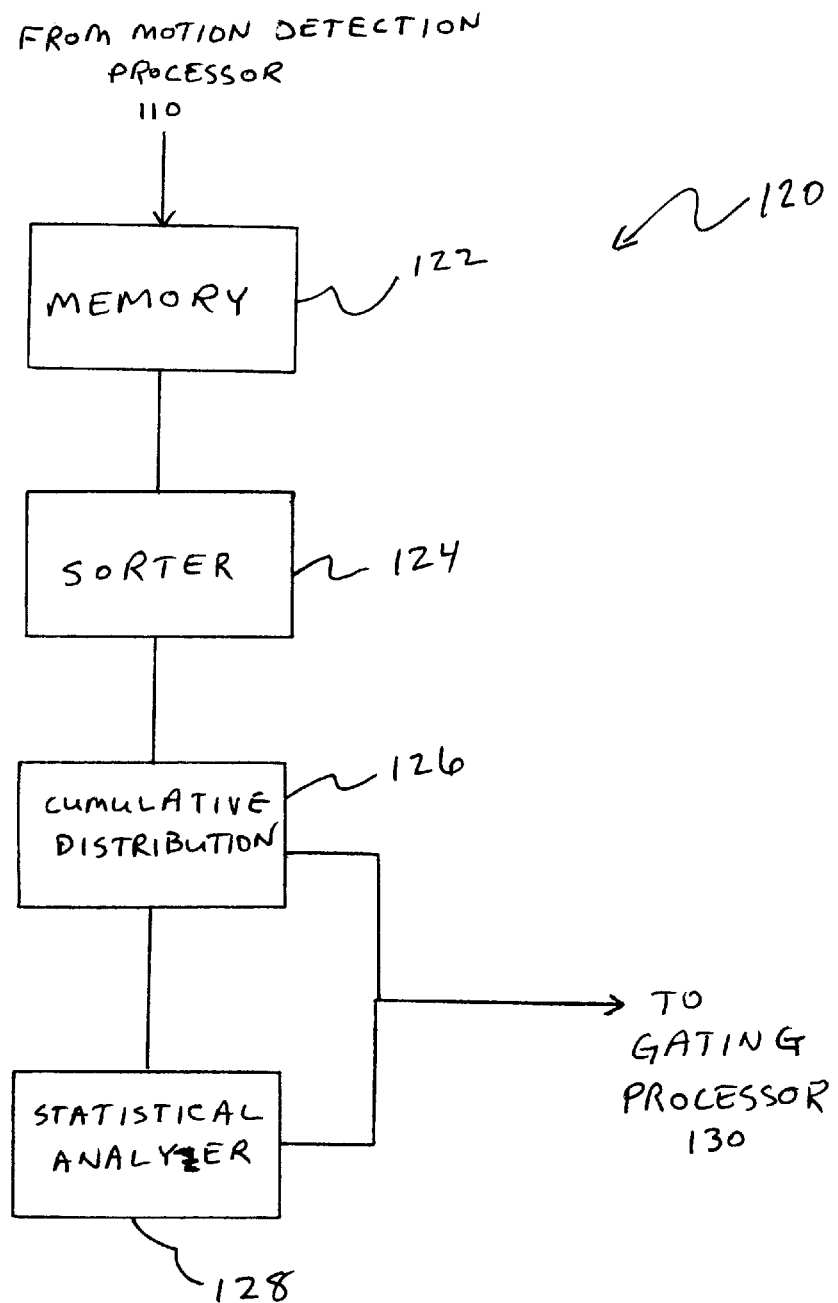

In a preferred embodiment, an historical record of the motion measurements obtained during an imaging experiment is maintained by a motion history module 120. During the imaging experiment, the motion history module is continually updated with each new motion measurement derived by the motion detector 110. With further reference to FIG. 2, the motion history module 120 preferably incudes a memory 122 in which the motion measurements from the motion detector 110 are loaded or otherwise held. Optionally, as an alternative to the memory 122, other storage devices may be employed, e.g., the motion measurement may be magnetically or optically stored on a disk or tape. Alternately, the memory 122 stores all the motion measurements obtained during an imaging experiment, or some windowed fraction thereof representing the most recently obtained motion measurement.

A sorter 124 sorts the motion measurements maintained in the memory 122 by their respective values. From the sorted motion measurement, a distribution processor 126 computes a cumulative distribution to determine what fraction thereof lie in a particular motion state. In a preferred embodiment, a statistical analyzer 128 determines selected statistical properties or measurements of the cumulative distribution such as, e.g., the mean, median, percentile, etc.

Based on the motion measurements from the motion detection processor 110 and data from the motion history module 120, a gating processor 130 gates the image obtained to the motion experienced during the imaging experiment. Preferably, the cumulative distribution from the motion history module 120 acts as a reference for determining a relative state of motion at which the image data is or was obtained based upon the motion measurement (obtained from the motion detection processor 110) associated with the particular image data. Optionally, the gating is carried out by the gating processor 130 prospectively or retrospectively. In prospective embodiments, the gating processor 130 preferably controls one or both of the control processor 20 or the receiver 30 such that image echos are generated and/or image data is received in accordance with a desired or selected state of motion. For example, the control processor 20 may be directed to trigger the MRI scanner 10 so as to produce imaging echos at a particular time corresponding to the desired or selected state of motion, and/or the receiver 30 may be directed to acquire echos at a particular time corresponding to the desired or selected state of motion. In a retrospective embodiment, a specific fraction of image data from a set of continuously acquired image data is select or identify such that the specific fraction corresponds to a desired or selected state of motion. The image data is then rejected, accepted and/or loaded or binned into the memory 50 accordingly. In this manner, gating is carried out in reference to the dynamically changing motion experienced during imaging insomuch as the historical record of motion measurements is iteratively updated during imaging. Accordingly, random shifts, drift or other changes in the motion experienced during imaging may be compensated for appropriately by continually updating, during the imaging experiment, the frame of reference to which the image date is compared.

Optionally, maximum and/or minimum motion limits are determined the cumulative distribution and the statistical properties thereof. For example, the maximum motion limit is determined by finding the center value "center" of the sorted motion measurements, i.e., the mean or median of cumulative the distribution. A first dispersive measurement "disp1" (e.g., the mean deviation, standard deviation, root mean square, fourth root of the mean fourth power, etc.) is then calculated relative to the center value. A second dispersive measurement disp2 is then evaluated for the data greater than center+disp1. Optionally, the dispersion "dispN" is recursively evaluated for data greater than center+disp1+disp2+. . . +dispN. Ultimately, the maximum motion limit is given as center+disp1+disp2+. . . +dispN. Preferably, two recursions are taken such that the maximum motion limit is given as center+disp1+disp2.

Likewise, for the minimum motion limit, disp1 . . . dispN are evaluated for data less than the center. According, the minimum motion limit is given by center−disp1−disp2−. . . −dispN, where two recursions are preferred. Note that this description does not imply that dispN are necessarily the same when evaluating the maximum motion limit and the minimum motion limit. In general, they are not the same and preferably the two limits are determined independently.

In any event, preferably, when image data is acquired with associated motion measurements that are outside the determined maximum and minimum motion limits, that image data is rejected. In this manner, spurious or anomalous image data is not included in the reconstruction. This is particularly advantageous considering that body parts or specific anatomy is typically confined to a set or limited range of motion.

Optionally, the gating processor 130 is programed or otherwise set to carry out image gating in a variety of desired manners. For example, it may be set to accept, trigger or bin image data lines or segments: (i) when their associated motion measurement is above or below a user defined threshold; (ii) when their associated motion measurement is between a user defined percentile threshold and the maximum motion limit or the minimum motion limit; (iii) when their associated motion measurement is between any two user defined percentile thresholds; (iv) using a variable percentile threshold that depends on their impressed encoding state or encoding state ordering; (v) are between a variable percentile threshold that depends on their impressed encoding state or encoding state order, and the motion measurement maximum or minimum limit; (vi) are between two variable percentile thresholds that depend on their impressed encoding state or encoding state ordering; etc. Additionally, it may be use to or relate to: the measuring of the average period of a motion by detecting a zero crossing of the mean or median of the cumulative distribution; using the statistical measures to detect changes in the rate or amplitude of a patient's motion cycle and rescanning previously acquired data to account for the change in state; using the statistical measures to detect changes in the rate or amplitude of the patient's motion cycle and aborting the scan; using the statistical measures to detect changes in the rate or amplitude of a patient's motion cycle and moving the image slice plane of volume to compensate for a change in position; or statistical measures from multiple navigator excitations can be computed and appropriate segmentation can be applied for triggering, accepting or rejecting data.

As will be understood by those of ordinary skill in the art, preferably, the processors and modules described herein are implemented via a software configuration, a hardware configuration, or a combination of both. Moreover, the functions of each may optionally be combined or separated as desired for efficiency or otherwise.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of MRI imaging, said method comprising:
   (a) imaging a region of interest of a patient with an MRI scanner;
   (b) acquiring image data resulting from the imaging;
   (c) reconstructing an image of the region of interest from the image data;
   (d) generating navigator echoes during the imaging;
   (e) collecting the navigator echos;
   (f) deriving, from each navigator echo, a measurement of patient motion experience during the imaging;
   (g) maintaining a dynamically updated historical record of the measurements; and,
   (h) gating at least one of the imaging, acquiring and reconstructing based on the historical record.

2. The method according to claim 1, said method further comprising:

sorting the measurements in the historical record by their respective values; and, determining a cumulative distribution from the sorted measurements such that the cumulative distribution acts as a reference for gating the image.

3. A method of imaging a patient with an MRI scanner, said method comprising:

(a) imaging a region of interest of the patient with the MRI scanner;

(b) acquiring image data resulting from the imaging;

(c) reconstructing an image of the region of interest from the image data;

(d) generating navigator echoes during the imaging;

(e) collecting the navigator echos;

(f) deriving, from each navigator echo, a measurement of patient motion experience during the imaging;

(g) maintaining a historical record of the measurements, wherein the historical record is iteratively updated during the imaging as successive measurements are derived; and, (h) selecting parameters for the acquisition of image data to compensate for motion or specific image data for reconstruction based on the historical record.

4. The method according to claim 3, wherein the historical record comprises all of the measurements obtained during the imaging.

5. The method according to claim 3, wherein the historical record comprises a fraction of all the measurements obtained during the imaging, said fraction corresponding to those measurements most recently obtained.

6. A method of MRI imaging, said method comprising:

(a) imaging a region of interest of a subject with an MRI scanner;

(b) acquiring image data resulting from the imaging;

(c) reconstructing an image of the region of interest from the image data;

(d) generating navigator echos during the imaging;

(e) collecting the navigator echoes;

(f) deriving, from each navigator echo, a measurement of motion experience during the imaging;

(g) associating the image data with measurements based on the respective image data's temporal proximity to the navigator echo from which each measurement was derived;

(h) maintaining a dynamically updated historical record of the measurements;

(i) determining at least one of a maximum and a minimum measurement limit from the historical record such that image data associated with a measurement beyond the limit is not used in reconstructing the image; and, (j) selecting parameters for the acquisition of image data to compensate for motion or specific image data for reconstruction based on the historical record.

7. A medical imaging apparatus comprising:

an MRI scanner which obtains images of a subject positioned therein, said MRI scanner operable to produce navigator echoes during imaging of the subject with the MRI scanner;

motion detection means for processing each of the navigator echoes to obtain motion measurements representative of a state of motion of the subject during imaging;

a storage device in which a dynamically updated historical record of the motion measurements are maintained; and, a gating processor which accesses the historical record, said gating processor gating the images obtained from the MRI scanner.

8. The medical imaging apparatus of claim 7, wherein the historical record is iteratively updated during the imaging as successive motion measurements are obtained.

9. The medical imaging apparatus of claim 8, wherein the historical record comprises all of the motion measurements obtained during the imaging.

10. The medical imaging apparatus of claim 8, wherein the historical record comprises a fraction of all the motion measurements obtained during the imaging, said fraction corresponding to those motion measurements most recently obtained.

11. The medical imaging apparatus of claim 7, further comprising:

a human-viewable output device for rendering images obtained from the MRI scanner.

12. A medical imaging apparatus, comprising:

an MRI scanner which obtains images of a patient positioned therein, said MRI scanner operable to produce navigator echoes during imaging of the patient with the MRI scanner;

motion detection means for processing each of the navigator echoes to obtain motion measurements representative of a state of motion of the patient during imaging;

a storage device in which an iteratively updated historical record of the motion measurements are maintained;

a sorter which sorts the motion measurements in the historical record according to their respective values;

means for determining a cumulative distribution from the sorted motion measurements; and, a gating processor which accesses the historical record, said gating processor gating the images obtained from the MRI scanner using said cumulative distribution as a frame of reference.

13. The medical imaging apparatus of claim 12, further comprising:

a reconstruction processor which reconstructs image data obtained from the MRI scanner into images; and, a statistical analyzer which determines statistical properties of the cumulative distribution, said statistical properties being used to compute at least one of a maximum and minimum motion measurement limit, wherein image data obtained from the MRI scanner when an associated motion measurement is beyond the limit is not used in reconstructing the image.

* * * * *